United States Patent
Violette et al.

[11] Patent Number: 6,043,541
[45] Date of Patent: Mar. 28, 2000

[54] BIPOLAR-CMOS (BICMOS) PROCESS FOR FABRICATING INTEGRATED CIRCUITS

[75] Inventors: Michael Violette; Martin Ceredig Roberts, both of Boise, Id.

[73] Assignee: Micron Technology, Inc., Boise, Id.

[21] Appl. No.: 09/140,497

[22] Filed: Aug. 27, 1998

Related U.S. Application Data

[62] Division of application No. 08/585,453, Jan. 16, 1996.

[51] Int. Cl.⁷ ................................................. H01L 29/76
[52] U.S. Cl. .......................... 257/370; 257/378; 257/588
[58] Field of Search .................................... 257/370, 378, 257/588

[56] References Cited

U.S. PATENT DOCUMENTS

| | | | |
|---|---|---|---|
| 4,345,366 | 8/1982 | Brower | 29/571 |
| 4,694,562 | 9/1987 | Iwasaki et al. | 437/57 |
| 4,737,472 | 4/1988 | Schaber et al. | 437/59 |
| 4,764,482 | 8/1988 | Hsu | 437/57 |
| 4,818,720 | 4/1989 | Iwasaki | 437/58 |
| 4,847,213 | 7/1989 | Pfiester | 437/24 |
| 4,902,640 | 2/1990 | Sachitano et al. | 437/57 |
| 4,960,726 | 10/1990 | Lechaton et al. | 437/59 |
| 4,987,089 | 1/1991 | Roberts | 437/34 |
| 5,045,493 | 9/1991 | Kameyama et al. | 437/59 |
| 5,059,549 | 10/1991 | Furuhatta | 437/59 |
| 5,132,234 | 7/1992 | Kim et al. | 437/31 |
| 5,192,992 | 3/1993 | Kim et al. | 257/370 |
| 5,196,356 | 3/1993 | Won et al. | 437/31 |
| 5,286,991 | 2/1994 | Hui et al. | 257/306 |
| 5,354,699 | 10/1994 | Ikeda et al. | 437/34 |
| 5,358,884 | 10/1994 | Violette | 437/341 |
| 5,439,833 | 8/1995 | Hebert et al. | 437/31 |
| 5,455,444 | 10/1995 | Hsue | 257/413 |
| 5,494,844 | 2/1996 | Suzuki | 437/59 |
| 5,525,530 | 6/1996 | Watabe | 437/34 |

FOREIGN PATENT DOCUMENTS

| | | | |
|---|---|---|---|
| 61-139057 | 6/1986 | Japan | H01L 27/06 |
| 3-116774 | 5/1991 | Japan | H01L 27/06 |
| 4-92416 | 3/1992 | Japan | H01L 21/28 |
| 4-230023 | 8/1992 | Japan | H01L 21/265 |

*Primary Examiner*—Mark V. Prenty
*Attorney, Agent, or Firm*—Schwegman, Lundberg Woessner & Kluth, P.A.

[57] ABSTRACT

A BiCMOS integrated circuit is fabricated using a minimum number of wafer processing steps and yet offers the IC circuit designer five (5) different transistor types. These types include P-channel and N-channel MOS transistors and three different bipolar transistors whose emitters are all formed by a different process and all are characterized by different current gains and different breakdown voltages. A differential silicon dioxide/silicon nitride masking technique is used in the IC fabrication process wherein both P-type buried layers (PBL) and N-type buried layers (NBL) are formed in a silicon substrate using a single mask set and further wherein P-type wells and N-type wells are formed above these buried layers in an epitaxial layer, also using a single $SiO_2/Si_3N_4$ differential mask set. Two of the bipolar transistor emitters are formed by out diffusion from first and second levels of polysilicon, whereas the emitter of the third bipolar transistor is formed by ion implantation doping.

21 Claims, 4 Drawing Sheets

BIPOLAR-CMOS (BICMOS) PROCESS FOR FABRICATING INTEGRATED CIRCUITS

This application is a divisional of U.S. Ser. No. 08/585,453 filed Jan. 16, 1996.

TECHNICAL FIELD

The present invention relates generally to the fabrication of integrated circuits containing both bipolar transistors and complementary metaloxide-silicon (CMOS) transistors in a silicon wafer. More particularly, the present invention is directed to such a fabrication process wherein multiple bipolar transistors having different current gains and voltage breakdowns are produced by out-diffusing impurities from surface conductors of the integrated circuit into the silicon wafer to form the transistor emitters.

BACKGROUND ART

In the fabrication of static random access memories (SRAMS) as well as various other types of integrated circuits, it is known construct both P-channel and N-channel MOS transistors in a silicon wafer and to electrically isolate these transistors by the use of N-wells and P-wells, respectively. CMOS integrated circuits offer a more powerful circuit operation than either N-channel or P-channel circuits alone. This factor, combined with the lower power consumption and increased speed, has made CMOS the favored technology for the manufacture of microprocessors and memory devices. It is also well known to construct bipolar transistors in these integrated circuits in order to provide added circuit flexibility and current drive capability to these integrated circuits.

Earlier processes used for manufacturing these BiCMOS integrated circuits utilized separate and dedicated photoresist masking steps to form CMOS transistors on the one hand and the bipolar transistors on the other hand in order to provide the necessary processing isolation required in defining, doping, and making electrical connections to these different types of transistors. Typically, the areas of the silicon wafer in which the CMOS transistors were formed were subjected to a specific series of photolithographic masking and etching steps using photoresist masks to implant and then drive in dopant impurities into the CMOS transistor regions. Another completely different series of photolithographic masking and etching steps were then used for masking the area of the silicon wafer in which the bipolar transistor regions were formed using ion implantation and drive in diffusion processes well known in the art.

In order to reduce the number of processing steps required in the above prior art BiCMOS process, there has been developed a new and improved BiCMOS process wherein the bipolar transistors formed in the silicon wafer do not require dedicated photoresist masking and etching processes. This feature in turn thereby significantly reduces the total number of individual process steps and reticles required in the overall integrated circuit process flow. This new and improved process is disclosed and claimed in U.S. Pat. No. 4,987,089 issued to Ceredig Roberts, assigned to the present assignee and incorporated herein by reference.

SUMMARY OF INVENTION

The general purpose and principal object of the present invention is to provide still further new and useful improvements in the art of BiCMOS circuit fabrication and with respect to the novel process of U.S. Pat. No. 4,987,089. These improvements as disclosed and claimed herein serve to even further reduce the number of process steps and reticles required in the BiCMOS SRAM process flow for manufacturing these integrated circuits.

Another object of this invention is to provide a new and improved BiCMOS process of the type described which produces a maximum number of different transistor types, both MOS and bipolar, using the minimum number of individual integrated circuit fabrication steps.

Another object of this invention is to provide a new and improved BiCMOS process of the type described which operates to reduce manufacturing costs and enhance process yields.

Another object of this invention is to provide a new and improved BiCMOS process of the type described which operates to increase integrated circuit packing density.

Another object of this invention is to provide a new and improved BiCMOS process of the type described which is characterized by increased circuit design flexibility by offering three different bipolar transistor types having different gains and different voltage breakdown characteristics.

Another object of this invention is to provide a new and improved BiCMOS integrated circuit having improved bipolar transistor emitter connections.

A novel feature of this invention is the provision of a BiCMOS integrated circuit fabricated using a minimum number of wafer processing steps and yet offering the IC circuit designer five (5) different transistor types. These types include P-channel and N-channel MOS transistors and three different bipolar transistors whose emitters are all formed by a different process and each of which is characterized by a different current gain and a different breakdown voltage.

Another feature of this invention is the provision of a differential silicon dioxide/silicon nitride masking process wherein both P-type buried layers (PBL) and N-type buried layers (NBL) are formed in a silicon substrate using a single mask set and further wherein the P-type wells and the N-type wells are formed above these buried layers in an epitaxial layer, also using a single $SiO_2/Si_3N_4$ differential mask set.

To achieve the above purpose, objects, and novel features, the present BiCMOS integrated circuit fabrication process includes the steps of: forming first and second levels of polycrystalline silicon (polysilicon) on the surface of a silicon substrate and utilizing the first polysilicon level to electrically connect to an MOS transistor within the substrate (epitaxial layer) forming a bipolar transistor base region in the substrate; connecting the second level of polysilicon to the transistor base region; and out-diffusing impurities from the second level of polysilicon into the base region to thereby form the bipolar transistor emitter region, whereby separate ion implantation and drive-in diffusion steps to form the emitter region are eliminated.

In accordance with a preferred BiCMOS integrated circuit embodiment of the invention as a free-standing article of commerce and commensurate in scope with the broad article claims filed herein, there is provided a BiCMOS integrated circuit of the type having a first level of polysilicon connected to an MOS transistor in one region of a silicon substrate and a bipolar transistor formed in another region of the substrate. This embodiment is characterized in that the bipolar transistor emitter region is formed by connecting a second level of polysilicon to the bipolar transistor base region and out-diffusing impurities from second level of polysilicon to thereby convert the conductivity of the base region and form the transistor emitter region.

In accordance with the more specific process and device claims according to the present invention, there is provided a new and improved BiCMOS integrated circuit wherein initially N-type and P-type buried layers are formed in a silicon substrate and thereafter an epitaxial layer is formed on the surface of these N-type and P-type buried layers. Then, N-type and P-type wells are formed in the epitaxial layer using conventional CMOS processing technology. Next, the P-channel and N-channel MOS transistors are formed in adjacent N-wells and P-wells utilizing a first level of polysilicon as the MOS transistor gate electrodes. Then, using both first and second levels of polysilicon and further using a metal contact in combination with ion implantation, first, second, and third bipolar transistors are formed in adjacent regions of the epitaxial layer and in separate P-type or N-type wells therein. The emitter of the first bipolar transistor is formed by out-diffusion of impurities from a first level of polysilicon, whereas the emitter of the second bipolar transistor is formed by out-diffusion of impurities from the second level of polysilicon. The third bipolar transistor is formed by first implanting ions to form the emitter region within the previously formed base region of the transistor, and ohmic contact is made to the emitter via a metal connection. Each of the above three (3) bipolar transistors has a different current gain and a different breakdown voltage and thus affords the integrated circuit designer with a high degree of circuit design flexibility when making interconnections in the BiCMOS integrated circuitry thus formed.

The above brief summary of the invention, together with its stated objects, various related advantages and novel features, will become more readily apparent with reference to the following description of the accompanying drawings.

BRIEF DESCRIPTION OF THE DRAWINGS

FIGS. 1 through 4 are a series of abbreviated schematic cross sectional views showing a sequence of process steps used in a preferred embodiment of the invention.

FIG. 3 also illustrates the formation of a P-channel CMOS transistor in an N-type well, and the formation of the $P^+$ ohmic contact regions for the bases of the three bipolar transistors.

DETAILED DESCRIPTION OF THE PREFERRED EMBODIMENT

In the following detailed description of the preferred embodiment, references made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that structural, logical, physical, architectural, and electrical changes may be made without departing from the spirit and scope of the present invention. The following detailed description is, therefore, not to be taken in a limiting sense, and the scope of the present invention is defined only by the appended claims and their equivalents.

Figure 1:
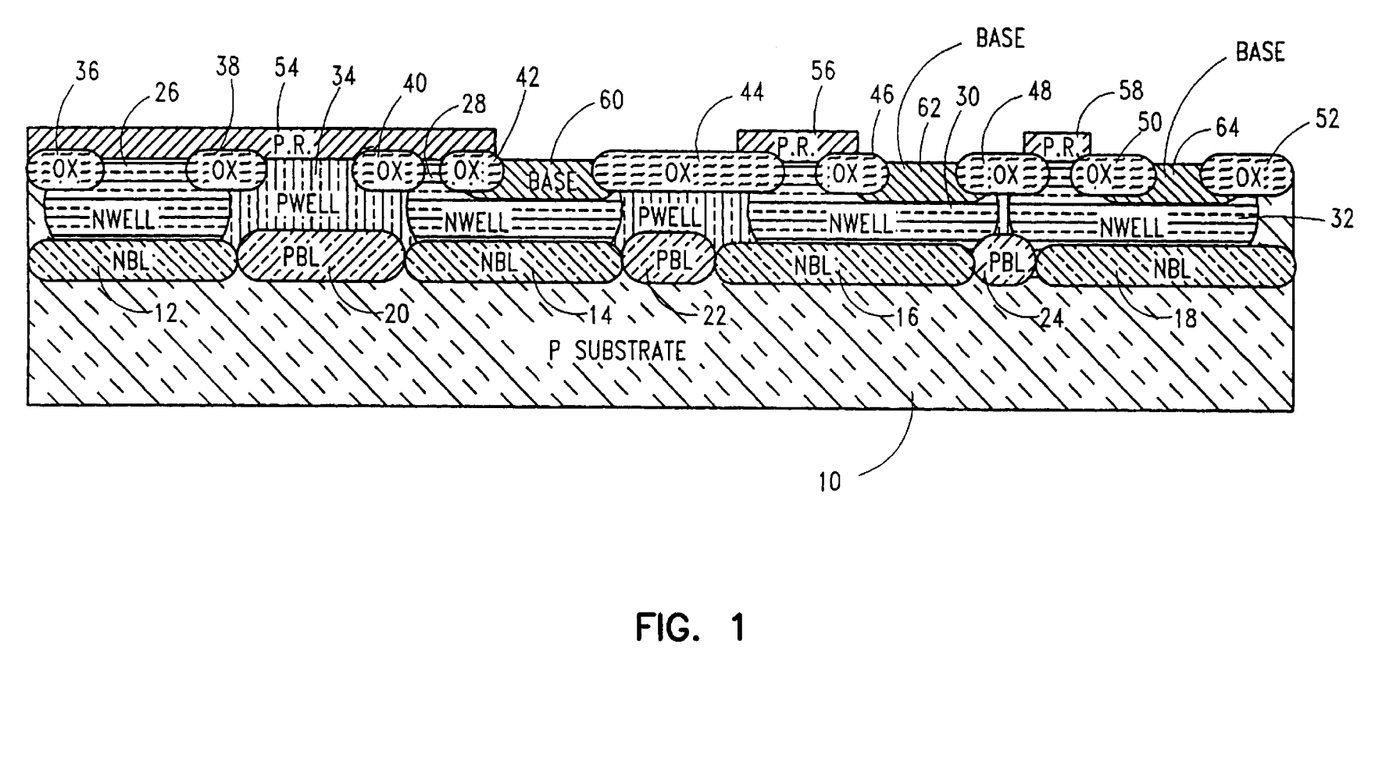
FIG. 1 is a schematic cross section view illustrating an intermediate device structure and related process for forming N-type and P-type buried layers (NBL and PBL) in a P-type substrate; the formation of N-type wells and P-type wells in an epitaxial layer on top of these buried layers using complementary metal-oxide-silicon (CMOS) wafer processing, the formation of the field oxide regions on the surface of the epitaxial layer; and the formation of the three base regions for the three types of bipolar transistors to be formed respectively in three of the N-type wells previously defined.
Figure 2:
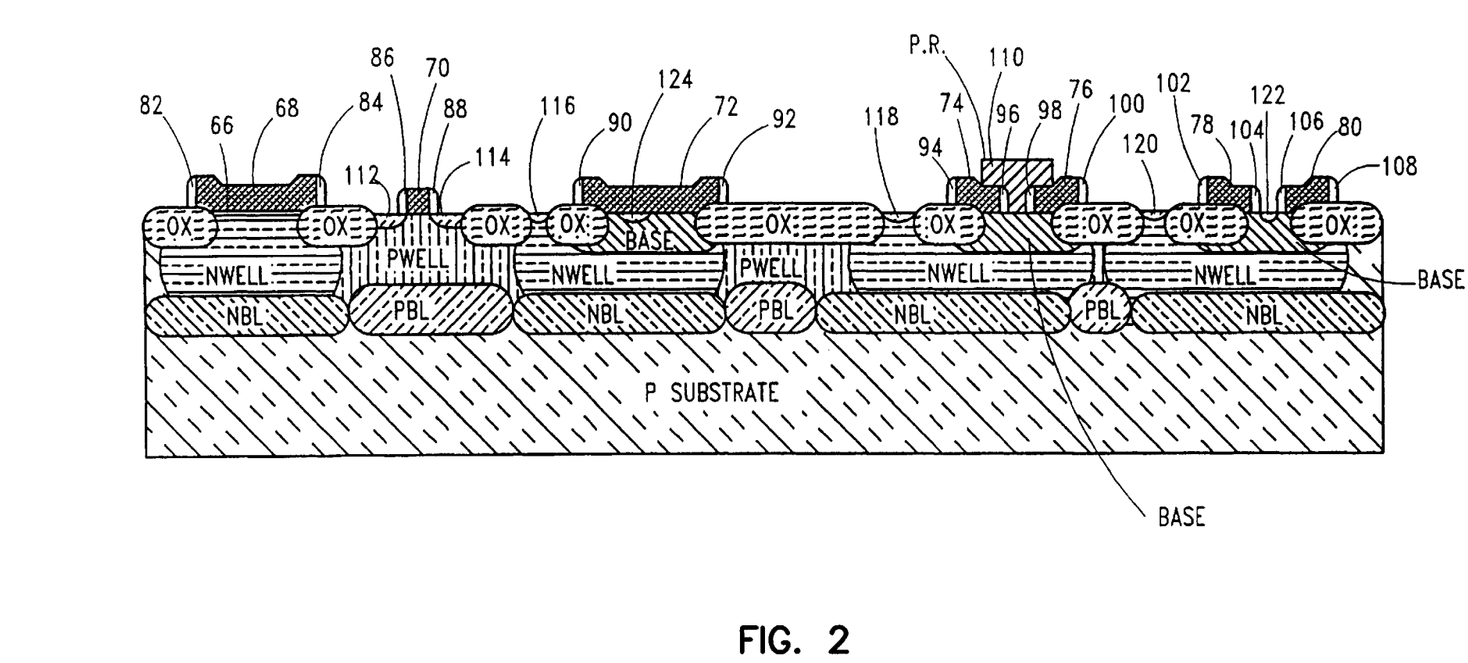
FIG. 2 is a schematic cross sectional diagram which illustrates the formation of an N-channel CMOS transistor in an P-type well and also the formation of two (left side and right side) of the three bipolar transistor emitters for two of the different types of bipolar transistors respectively shown to the right of the MOS transistor.
Figure 3:
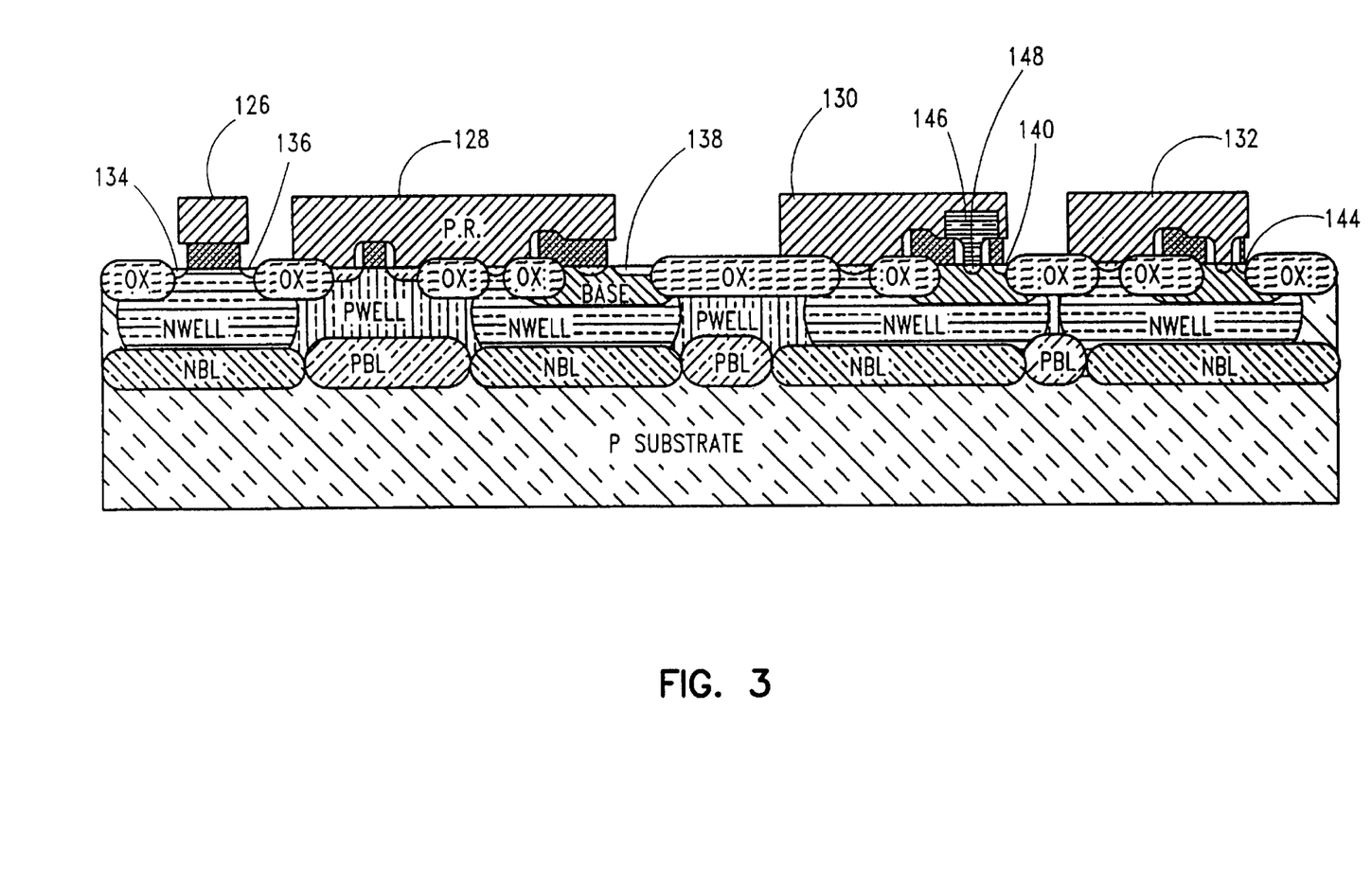
FIG. 3 is a schematic cross sectional diagram illustrating the formation of a third bipolar transistor emitter and the central transistor of the three bipolar transistors shown.

Referring now to FIG. 1, the present wafer processing sequence starts with a P-type substrate 10 into which a plurality of N-type buried layers (NBL) 12, 14, 16, and 18 are formed by either diffusion or ion implantation doping and separated from the subsequently formed alternate P-type buried layers (PBL) 20, 22, and 24. As is well known in the art, the P-type and N-type heavily doped buried layers serve to reduce the resistance, e.g. bipolar transistor collector resistance, in the transistors which are subsequently formed above these buried layers. Inasmuch as the intermediate structures shown in each of the FIGS. 1, 2, and 3 have been constructed using a large number of individual process steps which would correspond to a correspondingly large number of individual cross sectional views, the intermediate structures shown in FIGS. 1, 2, and 3 are used to represent these large numbers of process steps. However, the chemistries of these individual process steps will be described in substantial detail herein in order to clearly teach those skilled in the art the state-of-the-art MOS and bipolar processing which can be used in constructing a preferred embodiment of the invention.

In order to form the N-buried layers and the P-buried layers identified above, the initial P-type substrate starting material is first provided with a thin 200 angstrom layer of silicon dioxide, $SiO_2$ followed by the deposition of a thicker 700 angstrom layer of silicon nitride, $Si_3N_4$. Then, a photoresist mask is used to photolithographically define an opening over the NBL regions 12, 14, 16, and 18, whereafter a nitride etchant is used to remove the silicon nitride over the NBL regions to be formed. Then, an arsenic ion implantation step is used to implant arsenic ions through these openings and through the thin 200 angstrom layer of $SiO_2$ to form the 2 NBL layers 12, 14, 16, and 18 as shown.

In the next step of the process, the photoresist mask is removed and then the entire oxidized surface remaining is then further oxidized to a thickness of about 3000 angstroms, while driving in the arsenic ion implantation further into the NBL regions 12, 14, 16, and 18. However, in this additional oxidation step, no further oxidation will grow under the nitride regions remaining over the PBL regions 20, 22, and 24 to be formed. Therefore, in the next step of the process when the nitride is stripped off of the surfaces of the to-be-formed PBL regions 20, 22, and 24, this leaves two different oxide thicknesses, i.e., the remaining thick oxide over the NBL regions 12, 14, 16, and 18 and a thin oxide layer of 200 angstroms over the to-be-formed PBL regions 20, 22, and 24. This differential thickness mask in turn allows boron ions to be implanted through the thin oxide regions and thus form the PBL regions 20, 22 and 24. This boron implantation step thus penetrates the thin oxide over the PBL regions 20, 22, and 24 to form these P-type buried layers in the geometry shown. Since the arsenic dopant used to form the NBL regions is a slower diffusant than the boron dopant used to form the PBL regions, the PBL regions will out-diffuse to a greater height as shown in FIG. 1 as will be appreciated by those skilled in the art.

After the above wafer processing has been completed to form the NBL and PBL regions, all oxide is removed from the upper surfaces of the NBL and PBL regions, and the P-type substrate 10 is then transferred to a conventional epitaxial reactor wherein a continuous uniform epitaxial layer is formed across the entire upper surface of the NBL and PBL regions. Then, using conventional state-of-the-art CMOS processing technology, the N-type wells 26, 28, 30, and 32 and the P-type wells 34 are formed in the geometry shown. These N-type and P-type may be formed using the processes described in the above identified U.S. Pat. No. 4,987,089 issued to Ceredig Roberts.

In the next step of the process, the surface of the epitaxial layer of the silicon wafer 10 is appropriately masked and then exposed to another oxide deposition step wherein the field oxide regions 36, 38, 40, 42, 44, 46, 48, 50, and 52 are formed in the geometry shown. Then, a photoresist mask consisting a left side photoresist section 54 and intermediate and right side photoresist sections 56 and 58 are formed in the geometry shown in preparation for a boron ion implantation step used in the formation of the base regions 60, 62, and 64 of the three side-by-side bipolar transistors. The photoresist mask 54, 56, and 58 is then etched away from the upper surface of the structure shown in FIG. 1, and this structure is now ready for further processing in accordance with the desired geometry of the first level of polysilicon (poly 1) to be formed as shown in FIG. 2.

In the first step of the FIG. 2 processing, a thin gate oxide layer 66 is grown to a thickness of approximately 200 angstroms across the entire upper surface of the previously formed epitaxial layer, and then a first layer of polysilicon (poly 1) is formed initially over the entire surface of the structure shown in FIG. 2. The poly 1 layer is doped with an N-type dopant either in situ (i.e., during deposition) or subsequent to deposition by one of any number of techniques that are well known in the art. Then, using conventional photolithographic masking and etching techniques, the poly 1 layer is etched in the geometry shown in FIG. 2, thereby leaving (from left to right) the remaining regions or islands of poly 1 and identified as regions 68, 70, 72, 74, 76, 78, and 80. In addition, at the edges of each of these remaining regions of poly 1 are formed in the contoured geometry shown the oxide spacer regions 82, 84, 86, 88, 90, 92, 94, 96, 98, 100, 102, 104, 106, and 108 using spacer oxide formation processes which are well known in the art. For a further discussion of how these spacer oxide regions are formed, reference may be made to a book entitled *Silicon Processing for the VLSI Era*, Vol II by S. Wolf, pp 356–360, incorporated herein by reference.

In the next step of the process, the thin surface oxide not protected by the remaining poly 1 or oxide spacer regions is removed from the surface of the structure shown in FIG. 2 using either an oxide plasma etch or wet etch using $H_2SO_4$. Thereafter, a significant and critical photoresist mask 110 is formed in the geometry shown over the base region of the intermediate bipolar transistor. This photoresist mask region 110 will subsequently define the geometry of the poly 2 level contact to the emitter region to be formed within the base region of the intermediate bipolar transistor.

The structure shown in FIG. 2 is now ready for an $N^+$ ion implantation step used to form the $N^+$ source and drain regions 112 and 114 of the left side N-channel MOS transistor and the $N^+$ collector contact regions 116, 118, and 120 for the three bipolar transistors. This is accomplished using an arsenic ion implantation step to thus complete these source and drain and collector contact regions as previously defined. Simultaneously, the $N^+$ emitter region 122 in the far right side bipolar transistor is formed by this arsenic implantation step, and quite significantly, it should be noted here that neither the emitter for the first and second bipolar transistors (from left to right) are formed by this ion implantation step. That is to say, the emitter region 124 of the first bipolar transistor has been previously formed by the out-diffusion of impurities from poly 1 region 72 constructed in the geometry defined with its buried contact region extending through the thin gate oxide layer. This buried contact region is used to form, by out-diffusion, the emitter region 124 of the first bipolar transistor. However, at the FIG. 2 process stage, the to-be-formed emitter region in the central or second bipolar transistor is still protected by the photoresist mask 110 previously described.

Referring now to FIG. 3, the structure shown in this figure is now completed for the CMOS N-channel transistors and is now ready for the formation of the P-channel transistors in the N-wells, the formation of the bipolar transistor base contacts or ohmic contact regions and also the formation, by out-diffusion from poly level 2, of the emitter region of the second or central bipolar transistor. This is all accomplished by first depositing a level 2 layer of polysilicon (poly 2) over the entire surface of FIG. 2 after the photoresist mask 110 has been removed, doping the poly 2 layer with an N-type dopant, and then masking and etch removing all of poly 2 except for the T-shaped plug 146 which defines, by out-diffusion of N-type impurities, the emitter region 148 of the central bipolar transistor. Then a photoresist mask is formed and consists of P. R. mask sections 126, 128, 130, and 132 having the openings therein as shown to enable a boron implantation step to be performed in order to form the source and drain regions 134 and 136 of the P-channel CMOS transistor and also to form the base ohmic contact regions 138, 140, and 142 for the three bipolar transistors.

Figure 4:
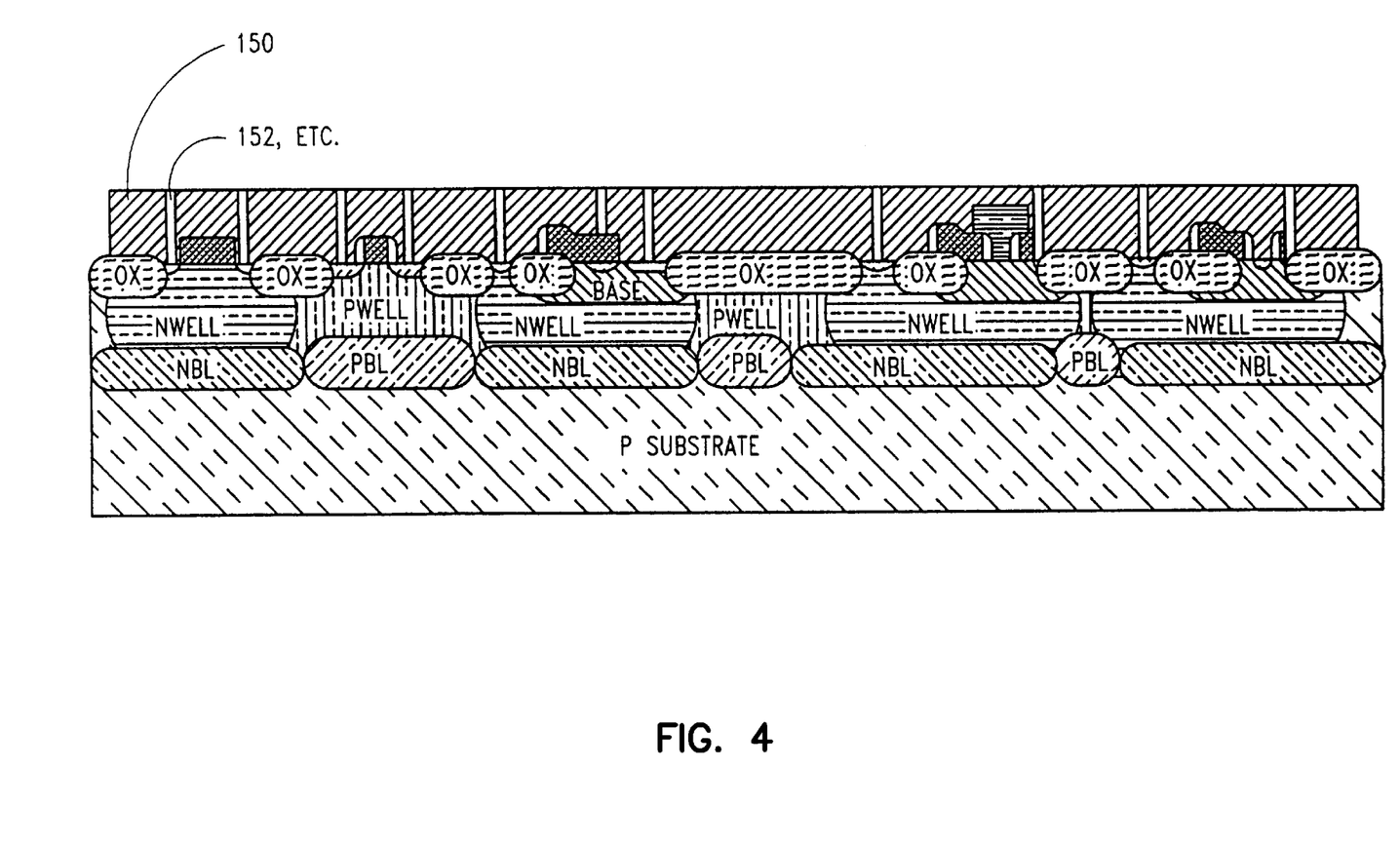
FIG. 4 is a schematic cross sectional view illustrating the formation of a thick borophosososilicate glass (BPSG) layer in the final process phase for the structure and the opening of vias therein in which electrical contacts are formed to make electrical connections to the P-type and N-type source and drain regions of the MOS transistors and to the collector, base, and emitter regions for the bipolar transistors. However, as will be explained in more detail below, the emitters of the first two bipolar transistors viewed from left to right in FIG. 4 are formed, respectively, by out-diffusion from the polysilicon line No. 1 (poly 1) and the subsequently formed polysilicon line No. 2 (poly 2).

Referring now to FIG. 4, this figure illustrates the final stages of the integrated circuit device processing wherein a thick layer of borophososilicate glass (BPSG) 150 is formed on the upper surface of the IC structure and then processed in a conventional fashion to form a plurality of vertical vias or interconnect openings 152. These openings 152 are used to receive metal conductors such as tungsten, W, which in turn make ohmic contacts to the source and drain regions of the CMOS transistors and also to all of the collector and base contacts of the three bipolar transistors, and further to make electrical contact to the emitter of the third or far right bipolar transistor as shown. Thus, the third or far right bipolar transistor has a metal contacted emitter, whereas the second or poly 2 bipolar transistor has an emitter region which has been formed by out-diffusion from poly 2 and the emitter region of the first bipolar transistor is formed by out-diffusion from poly 1 as previously described.

Thus, in addition to offering state of the art CMOS technology for forming P-channel and N-channel CMOS transistors, the present process further provides for the construction of three different types of bipolar transistors which can be constructed to have, respectively, from left to right as shown in FIG. 4, a high gain and low breakdown voltage, a lower gain and a higher breakdown voltage, and an intermediate gain and intermediate breakdown voltage for the metal contacted emitter. As is well known in the art, both the gain and breakdown voltage are related to the depth to which the emitter is diffused into the base region of a planar transistor. The smaller the base width between emitter-base junction and base-collector junction, the higher the transistor current gain and the lower the transistor breakdown voltage. The poly 1 emitter will be formed to the greatest depth within the base region of the first bipolar transistor, whereas the poly 2 emitter will be formed to the most shallow depth into the base region to thereby form the bipolar transistor with the highest breakdown voltage, but lowest gain. Intermediate these high and low gains and low and high breakdown voltages respectively is the third or far right bipolar transistor shown in FIG. 4 having the metal contacted emitter.

Various modifications may be made in and to the above described embodiments without departing from the spirit and scope of this invention. Accordingly, many device and process modifications available to those skilled in the art and useful in manufacturing a wide variety of integrated circuits other than static random access memories (SRAMs) are clearly within the scope of the following appended claims.

We claim:

1. A bipolar/complementary metal-oxide-silicon (BiCMOS) integrated circuit structure including a silicon substrate having N-type buried layers and P-type buried layers therein and an epitaxial layer disposed above the N-type buried layers and P-type buried layers and having different conductivity type wells formed therein; N-channel and P-channel MOS transistors formed in different conductivity type wells in the epitaxial layer and having transistor gate regions formed of a first level of polysilicon; a bipolar transistor formed in yet another well in the epitaxial layer and having collector, base and emitter regions within the well, with the emitter region being connected directly to either a first level or a second level of polysilicon and created by impurities received by out-diffusion from either the first or second levels of polysilicon; a second bipolar transistor formed in still another well within the epitaxial layer and having its emitter region formed by contact to either the first or second levels of polysilicon and out-diffusion of impurities therefrom; and yet a further bipolar transistor formed in a further well within the epitaxial layer and having its emitter region formed by ion implantation into the surface of the epitaxial layer.

2. The structure defined in claim 1 wherein a thick layer of glass is formed atop the first and second polysilicon levels and atop the epitaxial layer, and electrical interconnects are passed through the glass layer to thereby make ohmic contacts to all of the transistors.

3. A BiCMOS integrated circuit including a silicon substrate having N-type buried layers and P-type buried layers therein and an epitaxial layer disposed above the N-type buried layers and P-type buried layers and having different conductivity type wells formed therein, BiCMOS circuit comprising:

N-channel and P-channel MOS transistors formed in different conductivity type wells in the epitaxial layer and having transistor gate regions formed of a first level of polysilicon;

a first bipolar transistor formed in another well in the epitaxial layer, the first bipolar transistor having a first gain and a first breakdown voltage;

a second bipolar transistor formed in yet another well in the epitaxial layer, the second bipolar transistor having a second gain lower than the first gain and a second breakdown voltage higher than the first breakdown voltage; and a third bipolar transistor formed in still another well in the epitaxial layer, the third bipolar transistor having a third gain and a third breakdown voltage, the third gain between the first gain and the second gain, and the third breakdown voltage between the first breakdown voltage and the second breakdown voltage.

4. The structure defined in claim 3, wherein:

the first bipolar transistor emitter contacts a first layer of polysilicon, and the emitter is formed by out-diffusing impurities from the first layer of polysilicon.

5. The structure defined in claim 4, wherein:

the second bipolar transistor emitter contacts a second layer of polysilicon, and the emitter is formed by out-diffusing impurities from the second layer of polysilicon.

6. The structure defined in claim 5, wherein the second layer of polysilicon is at a different level than the first layer of polysilicon.

7. The structure defined in claim 4, wherein:

the third bipolar transistor emitter is formed by ion implantation into the epitaxial layer, and further comprises a metal connection defining an ohmic contact to the emitter.

8. An integrated circuit including a silicon substrate having N-type buried layers and P-type buried layers therein and an epitaxial layer disposed above the N-type buried layers and P-type buried layers and having different conductivity type wells formed therein, the integrated circuit comprising:

N-channel and P-channel MOS transistors formed in different conductivity type wells in the epitaxial layer and having transistor gate regions formed of a first level of polysilicon;

a first bipolar transistor having a base region formed in the substrate, the first level of polysilicon formed over the base region, and an emitter formed from out-diffusion of impurities from the first level of polysilicon into the base region; and a second bipolar transistor having a base region formed in the substrate, a second level of polysilicon formed over the base region, and an emitter formed from out-diffusion of impurities from the second level of polysilicon into the base region; and a third bipolar transistor, having a base region formed in the substrate, an emitter region formed by ion implantation into the base region, and a metal connection forming an ohmic contact to the emitter region.

9. The structure defined in claim 8, wherein the first bipolar transistor has a gain higher than the gain of the second bipolar transistor and wherein the first bipolar transistor has a breakdown voltage lower than the breakdown voltage of the second bipolar transistor.

10. The structure defined in claim 9, wherein the third bipolar transistor has a gain between the gains of the first and second bipolar transistors and a breakdown voltage between the breakdown voltages of the first and second bipolar transistors.

11. A BiCMOS integrated circuit including a silicon substrate, comprising:

a p-channel and an n-channel MOS transistor formed in the silicon substrate;

a first level of polysilicon formed on the MOS transistors, the first level of polysilicon connected to the MOS transistors within the substrate;

a first bipolar transistor having a base formed in the substrate, a second level of polysilicon formed on the base region, and an emitter region formed by out-diffusing impurities from the second polysilicon level;

a second bipolar transistor having a base formed in the substrate, the base connected to either the first or the second level of polysilicon, and an emitter region formed by out-diffusing impurities from the first or the second level of polysilicon, wherein the first bipolar transistor emitter is formed to a depth greater than the emitter of the second bipolar transistor.

12. The BiCMOS integrated circuit described in claim 11, and further comprising:

a third bipolar transistor having a base formed in the substrate, an emitter formed by ion implantation of impurities into the base region, and a metal connection defining an ohmic contact to the emitter.

13. A BiCMOS integrated circuit including a silicon substrate, the BiCMOS circuit comprising:

N-channel and P-channel MOS transistors formed on the substrate, each MOS transistor having a gate region formed of a first level of polysilicon;

a first bipolar transistor formed on the substrate, and having a first gain and a first breakdown voltage;

a second bipolar transistor formed on the substrate, and having a second gain lower than the first gain and a second breakdown voltage higher than the first breakdown voltage; and a third bipolar transistor formed on the substrate, and having a third gain and a third breakdown voltage, the third gain between the first gain and the second gain, and the third breakdown voltage between the first breakdown voltage and the second breakdown voltage.

14. An integrated circuit including a silicon substrate having N-type buried layers and P-type buried layers therein and an epitaxial layer disposed above the N-type buried layers and P-type buried layers and having different conductivity type wells formed therein, the integrated circuit comprising:

N-channel and P-channel MOS transistors formed in different conductivity type wells in the epitaxial layer and having transistor gate regions formed of a first level of polysilicon;

a first bipolar transistor having a base region formed in the substrate, a first level of polysilicon formed over the base region, and an emitter formed from out-diffusion of impurities from the first level of polysilicon into the base region; and a second bipolar transistor having a base region formed in the substrate, the first level of polysilicon formed partially over the base region, a second level of polysilicon formed over the base region and over the first polysilicon layer in a T-shape, and an emitter formed from out-diffusion of impurities from the second level of polysilicon into the base region.

15. The integrated circuit defined in claim 14, and further comprising:

a third bipolar transistor having an emitter formed by ion implantation into the epitaxial layer, and a metal connection defining an ohmic contact to the emitter.

16. A BiCMOS integrated circuit including a silicon substrate, comprising:

a p-channel and an n-channel MOS transistor formed in the silicon substrate;

a first level of polysilicon formed on the MOS transistors, the first level of polysilicon connected to the MOS transistors within the substrate;

a first bipolar transistor having a base formed in the substrate, the first level of polysilicon formed on the base region, and an emitter region formed by out-diffusing impurities from the first polysilicon level;

a second bipolar transistor having a base formed in the substrate, the base connected to either the first or the second level of polysilicon, and an emitter region formed by out-diffusing impurities from the first or the second level of polysilicon; and a third bipolar transistor having a base region formed in the substrate, an emitter formed by ion implantation of impurities into the base region, and a metal connection defining an ohmic contact to the emitter.

17. A BiCMOS integrated circuit including a silicon substrate, comprising:

N-channel and P-channel MOS transistors formed in the substrate, and having transistor gate regions formed of a first level of polysilicon;

a first bipolar transistor formed in the substrate, the first bipolar transistor having a first gain and a first breakdown voltage;

a second bipolar transistor formed in the substrate, the second bipolar transistor having a second gain lower than the first gain and a second breakdown voltage higher than the first breakdown voltage; and a third bipolar transistor formed in the substrate, the third bipolar transistor having a third gain and a third breakdown voltage, the third gain between the first gain and the second gain, and the third breakdown voltage between the first breakdown voltage and the second breakdown voltage.

18. The structure defined in claim 17, wherein:

the first bipolar transistor emitter contacts a first layer of polysilicon, and the emitter is formed by out-diffusing impurities from the first layer of polysilicon.

19. The structure defined in claim 18, wherein:

the second bipolar transistor emitter contacts a second layer of polysilicon, and the emitter is formed by out-diffusing impurities, from the second layer of polysilicon.

20. The structure defined in claim 17, wherein:

the third bipolar transistor emitter is formed by ion implantation into the substrate, and the third bipolar transistor further comprises a metal connection defining an ohmic contact to the emitter.

21. A BiCMOS integrated circuit including a silicon substrate having N-type buried layers and P-type buried layers therein and an epitaxial layer disposed above the N-type buried layers and P-type buried layers and having different conductivity type wells formed therein, BiCMOS circuit comprising:

N-channel and P-channel MOS transistors formed in different conductivity type wells in the epitaxial layer and having transistor gate regions formed of a first level of polysilicon;

a first bipolar transistor formed in another well in the epitaxial layer, the first bipolar transistor having a first gain and a first breakdown voltage, and an emitter contacting the first layer of polysilicon, the emitter formed by out-diffusing impurities from the first layer of polysilicon;

a second bipolar transistor formed in yet another well in the epitaxial layer, the second bipolar transistor having a second gain lower than the first gain and a second breakdown voltage higher than the first breakdown voltage, an emitter contacting a second layer of polysilicon, the emitter is formed by out-diffusing impurities from the second layer of polysilicon; and a third bipolar transistor formed in still another well in the epitaxial layer, the third bipolar transistor having a third gain and a third breakdown voltage, the third gain between the first gain and the second gain, and the third breakdown voltage between the first breakdown voltage and the second breakdown voltage, the third bipolar transistor having an emitter formed by ion implantation into the epitaxial layer, and a metal connection defining an ohmic contact to the emitter.

* * * * *